United States Patent
Hsu et al.

(10) Patent No.: US 12,476,127 B2
(45) Date of Patent: Nov. 18, 2025

(54) VACUUM PROCESSING APPARATUS

(71) Applicant: Hitachi High-Tech Corporation, Tokyo (JP)

(72) Inventors: Chen Pin Hsu, Tokyo (JP); Masatsugu Fujita, Tokyo (JP); Satoshi Yamamoto, Tokyo (JP); Masakazu Isozaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 18/025,453

(22) PCT Filed: Mar. 15, 2022

(86) PCT No.: PCT/JP2022/011723
§ 371 (c)(1),
(2) Date: Mar. 9, 2023

(87) PCT Pub. No.: WO2023/175743
PCT Pub. Date: Sep. 21, 2023

(65) Prior Publication Data
US 2024/0297058 A1    Sep. 5, 2024

(51) Int. Cl.
*H01L 21/673* (2006.01)
*H01L 21/67* (2006.01)
*H01L 21/677* (2006.01)

(52) U.S. Cl.
CPC .. *H01L 21/67393* (2013.01); *H01L 21/67017* (2013.01); *H01L 21/67769* (2013.01); *H01L 21/67778* (2013.01)

(58) Field of Classification Search
CPC .............. H01L 21/677; H01L 21/673; H01L 21/67393
See application file for complete search history.

(56) References Cited

U.S. PATENT DOCUMENTS 11,244,844 B2 * 2/2022 Reuter ............. H01L 21/67769
2010/0102030 A1    4/2010 Kondoh
(Continued)

FOREIGN PATENT DOCUMENTS

JP    2008-258188 A     10/2008
JP    2012138540 A  *   7/2012
(Continued)

OTHER PUBLICATIONS

Search Report mailed Jun. 14, 2022 in International Application No. PCT/JP2022/011723.

*Primary Examiner* — Kaitlin S Joerger
(74) *Attorney, Agent, or Firm* — Miles & Stockbridge, P.C.

(57) ABSTRACT

A vacuum processing apparatus including a vacuum processing unit embracing a vacuum vessel into which a wafer to be processed is transferred and processed; a lock chamber into which the wafer is transferred; an atmospheric transfer unit embracing an atmospheric transfer chamber maintained at atmospheric pressure and inside which the wafer is transferred; and a wafer preserving container for stacking a processed wafer. The wafer preserving container is provided inside with an exhaust port which is placed behind the opening, in front of the stacking space, and in an upper and a lower edge regions relative to the stacking space and exhausts gas in the stacking space to outside and a manifold which is placed behind the stacking space, towards the opening between the upper edge region and the lower edge region, and has gas outlets to supply certain gas into the stacking space.

14 Claims, 7 Drawing Sheets

(56) References Cited

U.S. PATENT DOCUMENTS

| | | | |
|---|---|---|---|
| 2015/0024671 A1 | | 1/2015 | Taniyama et al. |
| 2016/0118282 A1 | * | 4/2016 | Maraschin et al. |
| 2019/0189485 A1 | * | 6/2019 | Ogawa .............. H01L 21/67389 |
| 2019/0311929 A1 | * | 10/2019 | Woo .................. H01L 21/67379 |
| 2022/0359250 A1 | * | 11/2022 | Woo .................. H01L 21/67393 |

FOREIGN PATENT DOCUMENTS

| | | | |
|---|---|---|---|
| JP | 2015-023037 A | | 2/2015 |
| JP | 2015-170752 A | | 9/2015 |
| JP | 2016-086161 A | | 5/2016 |
| JP | 2018198332 A | * | 12/2018 |
| JP | 6695945 B2 | * | 5/2020 |

\* cited by examiner

VACUUM PROCESSING APPARATUS

TECHNICAL FIELD

The present invention relates to a vacuum processing apparatus which transfers substrate-like samples such as semiconductor wafers into a vacuum processing vessel and processes the samples, the vacuum processing apparatus in which the samples put in a stocking container located in an atmospheric-side block of the vacuum processing apparatus placed under atmospheric pressure or a pressure approximate to it, which can be considered comparable to it, are transferred into the vacuum processing vessel within a vacuum-side block which is depressurized to a predetermined degree of vacuum. The invention pertains to, particularly, a wafer transfer apparatus which is located in the atmospheric-side block and in which the samples are transferred in its inside space maintained at atmospheric pressure or a pressure approximate to it, which can be considered comparable to it.

BACKGROUND ART

An even higher degree of integration and miniaturization of semiconductor devices progress more and more in recent years, and semiconductor wafers on which the circuits of semiconductor devices are formed are required to be maintained in a clean environment so that particles and moisture which could cause a circuit defect will not adhere to the wafer surface. For example, as for a vacuum processing vessel (a vacuum processing chamber) inside which semiconductor wafers are processed and an FOUP (Front-Open Unified Pod) inside which wafers are housed, it is required to keep their interior at a higher degree of cleanliness (cleanliness factor). This requirement is also made of a wafer transfer apparatus like an EFEM (Equipment Front End Module) in which semiconductor wafers are transferred in the inside space of a vessel which is placed under atmospheric pressure or an ambient pressure (approximate atmospheric pressure) approximate to it, which can be considered comparable to it, and maintained at that pressure; it is required to maintain the inside space of such apparatus at a higher degree of cleanliness.

In general, the inside space of the above wafer transfer apparatus is where wafers are transferred and passed between an FOUP, a lock chamber (a load lock chamber) which plays a role of an interface between the vacuum-side block and atmosphere-side block, and the abovementioned stocking container. In the space inside the wafer transfer apparatus, clean airflows are formed by putting floating particles in down flows formed by down flow generators such as FFUs equipped with a chemical filter, carrying them downward and filtering with intent to restrain particles and moisture from adhering to a wafer being transferred. Hence, oxygen concentration and the amount of moisture in the inside space are kept approximately equivalent to those inside an equipment structure such as a clean room where the vacuum processing apparatus is set up.

Even though such an arrangement is made, when a semiconductor wafer is taken out from an FOUP mounted on a stand in a front side of the wafer transfer apparatus and passed to the vacuum-side block and when the front opening of the FOUP is opened by a load port located between the FOUP and the interior of the wafer transfer apparatus, oxygen concentration and humidity inside the FOUP container rise to the same level as in the EFEM and the environment inside the FOUP becomes worse. To repress this, it is considered to supply inert gas (e.g., nitrogen gas, argon gas, etc.) or compressed dry air into the stocking container of the FOUP and replace its internal gas involving particles.

However, on the periphery of a wafer immediately after being processed in the vacuum processing vessel and carried out, particles of a highly reactive substance supplied or generated during processing remain. Hence, if such a wafer is carried into a FOUP, there is a risk of contaminating other wafers before being processed, put in the FOUP. For instance, as for wafer etching using plasma, when etching thin-film masks or wiring patterns on a wafer, halogen-based etching gas is used, such as HCl (hydrogen chloride), HCN (hydrogen cyanide), $SiF_4$ (silicon tetrafluoride), HBr (hydrogen bromide), $F_2$ (fluorine), etc. It is well known that these gases partially remain on a wafer as hydrogen halide even after an aging process that follows pattern processing as noted above.

Therefore, a technology is devised as follows: a processed wafer transferred from the vacuum-side block is once put in a preserving container located within the EFEM or in an external part connected to the EFEM and set to wait until the concentration of the remaining substance decreases sufficiently. After the concentration of the remaining substance has decreased below a certain level, the processed semiconductor wafer is transferred from the preserving container to the FOUP where it was. For example, the above preserving container for waiting is installed and coupled onto a sidewall of the EFEM such that its opening portion communicates with an opening located in the side wall of the EFEM, and the inside space of the preserving container is always open to ambient air in the EFEM.

Even for such a wafer preserving container in which wafers before being processed are temporarily stacked inside before being transferred to the vacuum-side block or processed wafers are returned to a position where it was in a lower FOUP, it is also required to prevent contamination of wafers inside the container due to the adhesion of particles and moisture to the wafers. The reason is as follows: when a wafer is carried into the preserving container, if ambient air inside the container has as much humidity as that inside the EFEM, there is a risk that a halogenated product remaining on the wafer, as mentioned above, reacts with moisture and this reaction forms a corrosive substance. For example, an aqueous solution of hydrogen chloride is generally known as a hydrochloric acid, and a corrosive product including hydrogen halide is liable to cause a fault such as disconnection of wiring patterns on the front surface of a wafer, a short circuit between lines, cross talk due to increased wiring resistance or parasitic capacitance, etc.

Regarding such a problem, technologies to repress occurrence of corrosion and contamination of wafers inside the stocking or preserving container for semiconductor wafers have heretofore been devised. For example, in Japanese Patent Application Laid-Open No. 2015-23037 (PTL 1), a technology as below is disclosed: when the front door of the wafer preserving container is opened to the atmosphere, a shower curtain is formed in the front of the container using purging gas or the like, thus repressing intrusion of an airflow with relatively high humidity from inside the EFEM.

Japanese Patent Application Laid-Open No. 2015-170752 (PTL 2) discloses the following: when the front opening of an FOUP is opened, in order to repress the rise of humidity inside the FOUP due to entrance of gas from outside, certain gas is supplied from two purging nozzles set secured on the bottom plate in the opening portion when the opening of the FOUP is opened.

CITATION LIST

Patent Literature

PTL 1: Japanese Patent Application Laid-Open No. 2015-23037
PTL 2: Japanese Patent Application Laid-Open No. 2015-170752

SUMMARY OF INVENTION

Technical Problem

In the prior art technologies, in a case where the opening of the preserving container in which wafers are set to wait before being transferred and retuned to an FOUP where they were is coupled with and communicates with the interior of the EFEM, the interior of the preserving container is exposed to an environment of gas inside the EFEM including down flows and the interiors of both are put in the same conditions. Hence, when stacked wafers are waiting inside, there is a risk that a halogen-based substance remaining on the surface or periphery of a processed wafer reacts with moisture and this reaction forms a corrosive product, resulting in contamination of the wafer.

When the front opening portion of the preserving container relevant to the prior-art technologies is opened to communicate with the interior of the EFEM, the interior of the container is put in direct contact with gas inside the EFEM, and an air flow with relatively high humidity formed by an FFU intrudes into the container. In addition, even in a case where inert gas is supplied into the preserving container to discharge (purge) particles of a substance that may become a source of contamination of the surface or periphery of a processed wafer, it turns out that, in an arrangement configured to only supply gas with relatively small humidity into the container, a down flow of gas continues to enter the preserving container from inside the EFEM, and it is difficult to keep a state in which the inside space of the container is entirely filled with purging gas and a source of contamination was removed out of the container. According to an investigation by the inventors, it is found that, in such an arrangement, humidity inside the container is decreased only by a few percentages in comparison with humidity inside the EFEM and the environment inside the container cannot be improved sufficiently.

Although an arrangement configured to shield an airflow from the EFEM using the shower curtain is disclosed in PTL 1, a large amount of purging gas has to be supplied into the container in order to effect such shielding sufficiently and there should be an increase in apparatus operating costs. Moreover, an oxygen level around the EFEM falls because of purging gas and there is a risk that a worker around it is exposed to a danger of a lack of oxygen. Therefore, while this prior art technology makes it achievable to lessen occasions in which particles inside the EFEM enter the preserving container by forming the shower curtain using compressed dry air such as CDA, there is a need for the supply of a large amount of purging gas from a semiconductor manufacturing factory and usage of a large flow of CDA entails a problem in which there should be an increase in costs of a facility in which semiconductor manufacturing equipment is installed and equipment operation.

Also, according to an investigation by the inventors, in a prior art technology like PTL 2, after a down flow in the EFEM flows downward along a wall of the EFEM, the flow is disturbed away from the wall surface at or below the top end of the opening portion of the wafer preserving container and develops into turbulence near the bottom end of the opening portion of the preserving container. Consequently, it has been found that most of gas with relatively high humidity inside the EFEM enters the interior of the preserving container from the vicinity of a bottom end part of the opening portion of the preserving container and a bottom plate abutting with this part. Moreover, in a case where purging gas is supplied from the vicinity of the bottom plate toward the interior of the EFEM for the purpose of preventing the entrance of such gas, it has been found that there is a risk that high humidity gas mentioned above is sucked into the preserving container on the contrary.

The above-described prior art technologies make no consideration for the problems noted above. The present invention is developed in view of the circumstances noted above, and an object of the invention resides in providing a vacuum processing apparatus enabling it to decrease humidity inside the preserving container, lessen contamination of wafers stacked inside the container, and improve processing yields.

Solution to Problem

The foregoing object is achieved by a vacuum processing apparatus including:
a vacuum processing unit embracing a vacuum vessel with a depressurized inside space into which a wafer to be processed is transferred and processed; a lock chamber into which the wafer before or after being processed is transferred; an atmospheric transfer unit with a casing embracing an atmospheric transfer chamber which is connected with the lock chamber and maintained at atmospheric pressure and inside which gas flows are formed from upward to downward and the wafer is transferred; and a wafer preserving container which embraces a processed wafer stacking space inside thereof, whose front end side is installed onto a wall surface of the casing, and whose interior communicates with the atmospheric transfer chamber via an opening located in the side wall, in which the wafer preserving container is provided inside with an exhaust port which is placed behind the opening, in front of the stacking space, and in an upper edge region and a lower edge region relative to the stacking space and exhausts gas in the stacking space to outside and a manifold which is placed behind the stacking space, towards the opening between the upper edge region and the lower edge region, and has gas outlets to supply certain gas into the stacking space.

Advantageous Effects of Invention

According to the present invention, it is possible to provide a vacuum processing apparatus enabling it to decrease humidity inside the preserving container, lessen contamination of wafers stacked inside the container, and improve processing yields.

DESCRIPTION OF EMBODIMENTS

The present invention pertains to a vacuum processing apparatus that is provided with at least one gas purging (introduction) port which is placed extending in a vertical direction in the back side of a wafer stacking space in a wafer preserving container which is located on an EFEM inside which down flows are formed and gas exhaust ports which are placed in the top and bottom portions of an entrance region of the wafer preserving container, facing an opening communicating with the interior of the EFEM, and extends in a horizontal direction; the vacuum processing apparatus enables it to decrease humidity inside the preserving container, lessen contamination of wafers stacked inside the container, and improve processing yields.

In the following, an embodiment of the present invention is described in detail based on the drawings. Across all drawings to explain this embodiment, elements having the same function are assigned the same reference sign and repeated descriptions thereof are omitted in principle.

However, the present invention should not be construed to limit its scope to the description of an embodiment that will be set forth hereinafter. Those skilled in the art will easily appreciate that a concrete configuration of the present invention may be modified without departing from the idea or spirit of the invention.

EXAMPLE 1

An example of the present invention is described below with FIGS. 1A through 11. Note that identical reference signs across the drawings denote identical components.

Figure 1A:
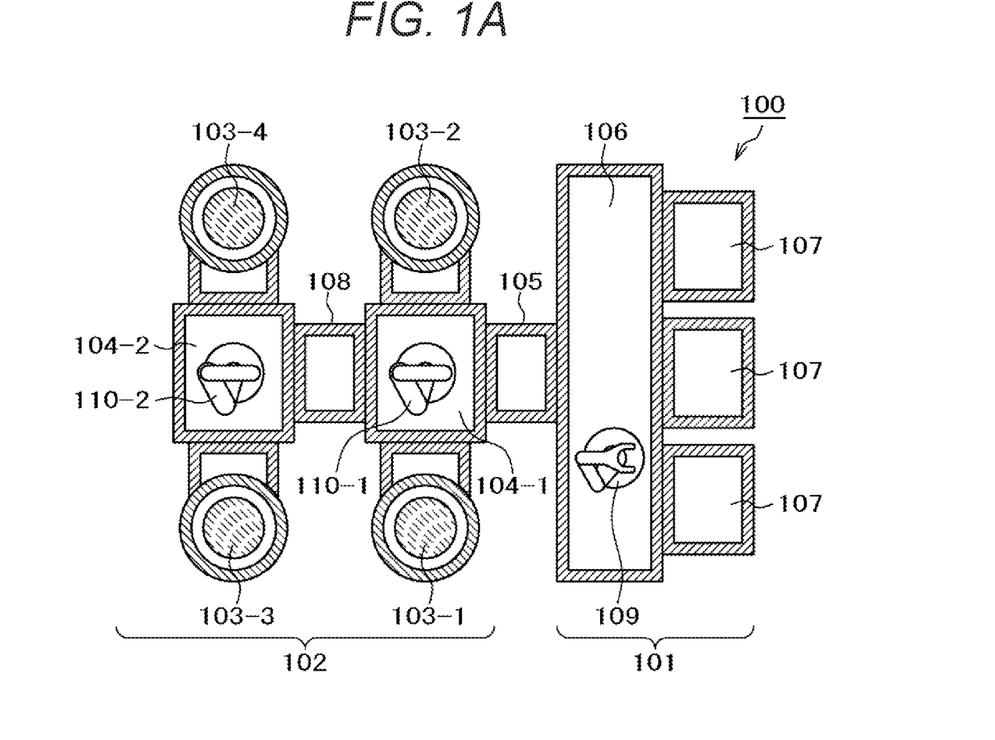
FIG. 1A is a diagram of a cross section of a vacuum processing apparatus schematically depicting a rough structure of the vacuum processing apparatus relevant to an example of the present invention.
Figure 1B:
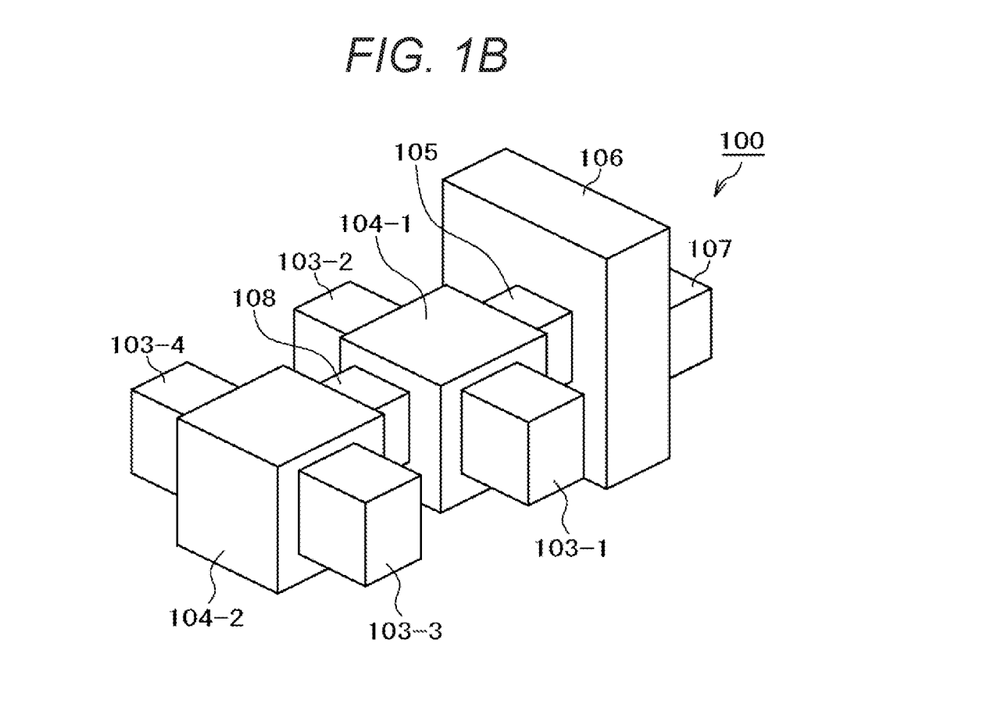
FIG. 1B is a perspective view of the vacuum processing apparatus depicting a rough structure of the vacuum processing apparatus relevant to the example of the present invention.

FIG. 1A is a diagram schematically depicting a rough structure of a vacuum processing apparatus 100 relevant to an example of the present invention and this diagram is a cross section when the vacuum processing apparatus 100 is viewed from above. FIG. 1B is a perspective view depicting the structure of the vacuum processing apparatus 100.

The vacuum processing apparatus 100 of the present example is provided with an atmospheric block 101 placed in its front side (the right side in FIG. 1A) and a vacuum block 102 placed in its rear side (the left side in FIG. 1B). The atmospheric block 101 is a part in which substrate-like samples such as wafers are transferred and positioned to be stacked in a container among others under atmospheric pressure. The vacuum block 102 includes a part in which the samples are transferred or subjected to processing among others under a pressure depressurized from the atmospheric pressure and in which pressure is increased or decreased with a sample being put in place.

The atmospheric block 101 is provided with an atmospheric transfer unit 106 including a casing whose external form is a cuboid or its similar shape approximate to it, which can be considered comparable to it, with its inside space being maintained at atmospheric pressure or its similar pressure approximate to it, which can be considered comparable to it, and a plurality of cassette stands 107 which are installed, lined along the front side face of the casing of the atmospheric transfer unit 106. On the top surfaces of the cassette stands, there are mounted FOUPs, i.e., cassettes inside which substrate-like samples such as semiconductor wafers which are to be processed or cleaned are stacked. The atmospheric block 101 is a place where wafers as the samples to be processed or cleaned, stacked inside each FOUP on the cassette stands 107, are transferred between the FOUP and the vacuum block 102 connected to the rear surface of the casing of the atmospheric transfer unit 106. Inside the casing of the atmospheric transfer unit 106, an atmospheric transfer robot 109 having arms for holding a wafer is placed to transfer such wafers.

The vacuum block 102 is provided with the following: a plurality of vacuum processing units 103-1, 103-2, 103-3, 103-4, each being provided with a vacuum vessel whose inside space is a processing chamber which is depressurized and in which a sample is processed; vacuum vessels which are connected with these vacuum processing units and whose inside spaces are vacuum transfer chambers 104-1, 104-2 which are transport spaces equipped with vacuum transfer robots 110-1, 110-2 to transfer a sample under a depressurized pressure; a vacuum vessel (a lock chamber vessel) which is placed between and connected with one of the vacuum vessels for vacuum transfer (vacuum transfer vessels) and the casing of the atmospheric transfer unit 106 and whose inside space is a lock chamber 105 which is a space for putting a wafer therein and the space placed to be communicable with the vacuum transfer chamber 104-1 and the casing of the atmospheric transfer unit 106; and a vacuum vessel which is placed between and connected with two vacuum transfer vessels and whose inside space is a transfer intermediate chamber 108 which is a space for putting a wafer therein between the vacuum transfer chamber 104-1 and the vacuum transfer chamber 104-2 and put communicable with these chambers. This vacuum block 102 is configured having the vacuum vessels whose internal spaces are depressurized and can be maintained at a pressure corresponding to a predetermined value of vacuum.

In addition, operations of the vacuum processing apparatus 100 including transfer operations by the atmospheric transfer robot 109 and the vacuum transfer robots 110-1, 110-2 mentioned above, wafer processing operations by the plurality of the vacuum processing units 103-1, 103-2, 103-3, 103-4, operations of sealing, opening, depressurizing, and pressurizing the inside space of the lock chamber 105, etc. are regulated by a control device, which is not depicted, connected with the respective parts of the apparatus that perform these operations so that signals can be transmitted and received to/from these parts via communication paths including wired or wireless ones. The control device is configured including the following: an interface for signal transmission and reception to/from an external communication path; a computing unit such as a microprocessor made of semiconductor devices; storage equipment such as RAM, ROM, a hard disk, and a removable disk to store software in which algorithms of computation by the computing unit are described and data such as values of signals which are communicated; and communication paths to make a connection among them to enable communication.

Figure 2:
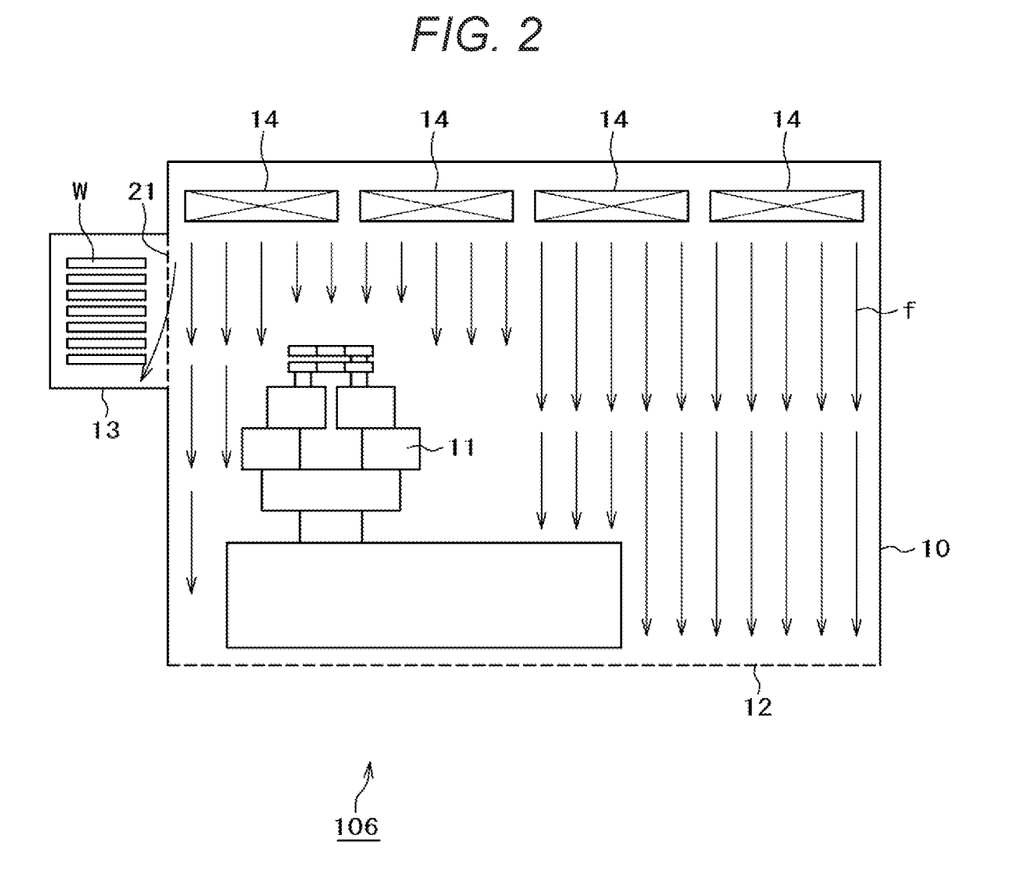
FIG. 2 is a diagram of a longitudinal section schematically depicting an outline of the structure of an atmospheric transfer unit of the vacuum processing apparatus relevant to the example of the present invention.

FIG. 2 is a diagram of a longitudinal section schematically depicting an outline of the structure of the atmospheric transfer unit 106 in the example depicted in FIGS. 1A and 1B. The EFEM 10 is the casing of the atmospheric transfer unit 106 with the cassette stands 107 installed along its front face, depicted in FIGS. 1A and 1B, this figure depicts a longitudinal section cut through a plane parallel with the front face of the casing when viewing the EFEM 10 from a forward point toward a backward direction.

As is depicted in FIG. 2, the EFEM 10 is fit with a wafer preserving container 13 having inside it a stacking space where a plurality of wafers: W can be stacked in an up-down direction, spaced with a gap between each of them. The wafer preserving container 13 is installed on the surface of at least either of side walls in a left-right direction (a left end side wall, as depicted in FIG. 2) of the casing with its opening side mating with an opening of the casing. According to the present example of FIG. 2, the wafer preserving container 13 faces the inside space of the EFEM 10 through its opening portion 21 located at its right end as depicted and an opening formed in the left end side wall of the EFEM 10. With the wafer preserving container 13 installed on the side wall of the EFEM 10, the opening portion 21 of the wafer preserving container 13 is kept open and the inside spaces of the wafer preserving container 13 and the EFEM 10 communicate with each other.

Additionally, the wafer preserving container 13 in the present example is installed in a so-called intermediate height position with its top and bottom ends being a certain distance away from the top and bottom ends of the left end side wall of the casing, as depicted, respectively. In addition, the opening portion 21 denotes a substantially rectangular front end portion of the casing 13' of the wafer preserving container 13 (see FIG. 3), that is, a planar area that is formed by connecting the points of installation on the left end side of the EFEM 10. In subsequent explanation, the opening portion is represented with a solid line or a dashed line denoting where that area is. Also, this opening portion 21 abuts with an opening of the side wall of the EFEM 10; the opening is formed beforehand on the left end side wall of the EFEM 10 and the rectangular front end portion of the casing 13' mates with this opening and is installed to cover around the opening. In subsequent explanation, the opening of the side wall and the opening portion 21 of the wafer preserving container 13 are described, regarded as substantially the same.

The inside space of the casing of the EFEM 10 defines a space (atmospheric transfer chamber) where a wafer W is transferred between the lock chamber 105 and each of the FOUPs mounted on the cassette stands 107. In this inside space, a transfer robot 11 (which corresponds to the atmospheric transfer robot 109 in FIG. 1A) is placed. This robot has multiple arms in which an end of each arm is coupled to an end of another arm by joints, the arms rotate around the joints, and a wafer W is loaded and held on the fore-end portions of distal arms; in this state, the robot transfers the wafer W while stretching and retracting the multiple arms. In a top part of the EFEM 10, FFUs (Fan Filter Units) 14 are placed, that is, multiple fans flowing out airflows drawn from above in a downward direction are juxtaposed in a horizontal direction (a left-right direction in FIG. 2). Ambient air around the vacuum processing apparatus 100 is sucked in by the FFUs and flows out inside the casing and airflows f in an up-down direction are formed inside the casing.

The airflows f flow out inside the EFEM 10 from the outlets in the undersides of the FFUs 14, as marked by arrows in FIG. 2, and flow out of the EFEM 10 through the openings of a louver 12 which is placed under the transfer robot 11 and at the bottom of the EFEM 10 and in which small plates are lined in a left-right direction, as depicted, spaced with a gap. Also, the airflows f in a left edge portion of the interior of the EFEM 10 flow downward along the side wall of the casing, which is in an upper position, of the wafer preserving container 13, that is, the airflows flow downward from the top end of the opening portion 21 of the wafer preserving container 13. Then, some of the airflows are deflected to left in FIG. 2 and to enter the inside space of the wafer preserving container 13. Hence, it follows that relatively high humidity gas including a certain quantity of moisture flows into the interior of the wafer preserving container 13 from the interior of the EFEM 10.

Figure 3:
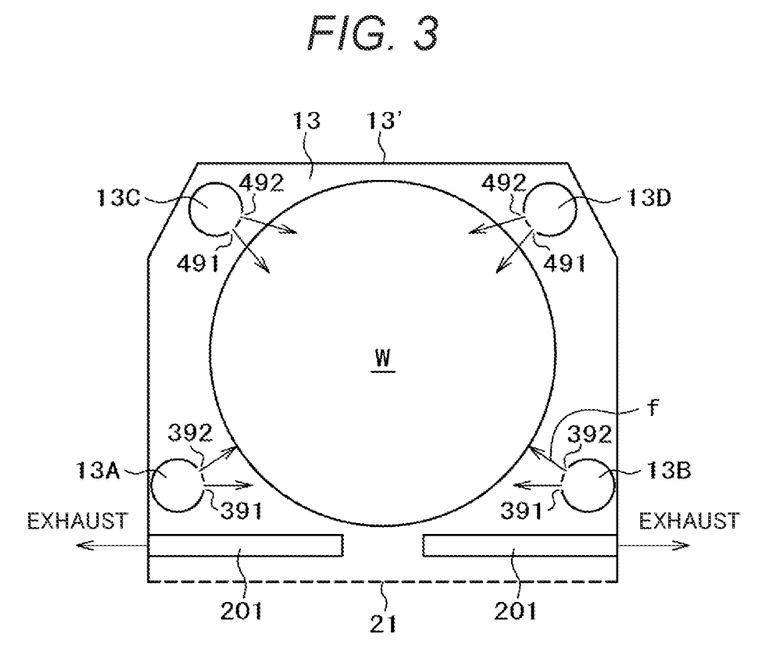
FIG. 3 is a diagram of a cross section depicting an outline of the structure of a wafer preserving container of the atmospheric transfer unit relevant to an example depicted in FIG. 2.

FIG. 3 is a diagram of a cross section depicting an outline of the structure of the wafer preserving container 13 of the atmospheric transfer unit 106 relevant to the example depicted in FIG. 2. This figure depicts a cross section of the wafer preserving container 13 cut through a horizontal plane in a certain height position between the top and bottom ends of its opening portion 21 with the opening portion 21 at the bottom. Therefore, a back side of the casing 13' of the wafer preserving container 13 is at the top of FIG. 3.

Figure 4:
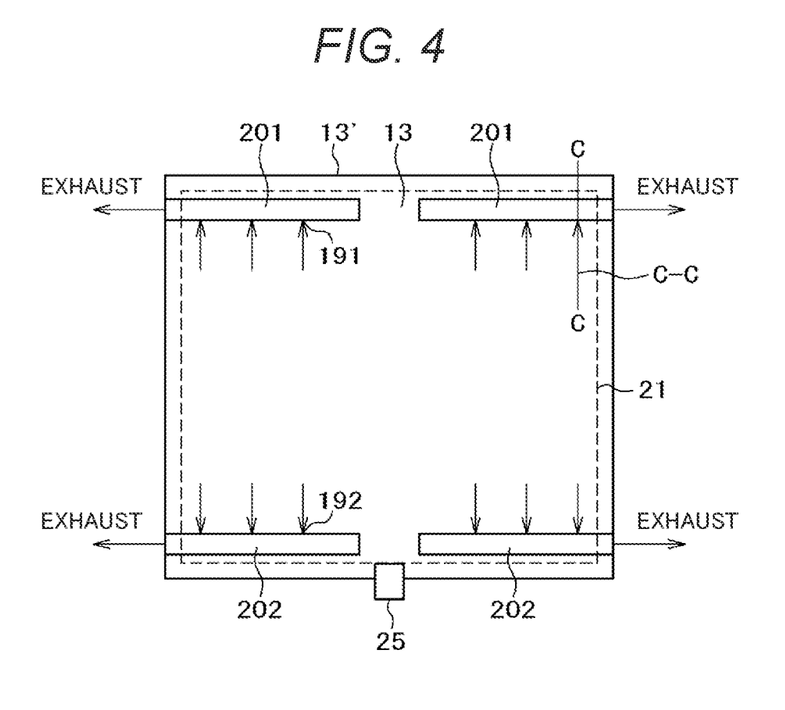
FIG. 4 is a diagram of a longitudinal section schematically depicting an outline of the structure of the wafer preserving container of the atmospheric transfer unit relevant to the example depicted in FIG. 2.

As in FIG. 4, a diagram of a longitudinal section schematically depicting an outline of the structure of the wafer preserving container 13 of the atmospheric transfer unit 106 relevant to an example depicted in FIG. 2, upper exhaust ports 201 and lower exhaust ports 202 are provided in upper and lower edge regions of the opening portion 21, respectively, in the present example. By operation of the upper exhaust ports 201 and the lower exhaust ports 202, an influence of the airflow f inside the EFEM 10 on the airflow inside the wafer preserving container is suppressed and moisture that is supplied from the airflow f is reduced.

Moreover, as is depicted in FIG. 3, purging manifolds 13A and 13B are placed in the front of the interior of the casing 13' of the wafer preserving container 13 and behind the upper exhaust ports 201 and the lower exhaust ports 202; from these manifolds, gas in which moisture or humidity is maintained at a certain low value, such as inert gas, is supplied toward the center of the interior. Furthermore, purging manifolds 13C and 13D are provided in the rear (back side) of the interior of the casing 13'. A plurality of wafers W are carried into the space surrounded by these purging manifolds 13A, 13B, 13C, 13D and held in a stand, which is not depicted, spaced from one another with a gap.

In an example depicted in FIG. 3, the purging manifolds 13A, 13B, 13C, 13D are placed around the wafers W and in four corners of the interior of the casing 13', as viewed from above, to allow for the wafers W to be stacked, spaced with a gap from these manifolds. Thus, the purging manifolds 13A and 13B are placed such that a horizontal distance between them (in a left-right direction, as depicted) is set larger than the diameter of the wafers W and configured to avoid collision of a wafer W with the purging manifolds 13A and 13B when carried in and out of the interior of the casing 13'. Note that a horizontal distance between the purging manifolds 13C and 13D is set shorter than the diameter of the wafers W.

Each of the purging manifolds 13A, 13B, 13C, 13D is a tube having a cylindrical form with a certain diameter and its internal hollow along the axis in an up-down direction (a direction perpendicular to the plane of paper in FIG. 3) communicates with a gas source of inert gas such as nitrogen or argon. Each of the purging manifolds 13A, 13B, 13C, 13D has gas outlets 391 and 392 or 491 and 492 which are two sequences of through holes which make airflows f, as marked with arrows in FIG. 3, along the axis of the cylindrical form in an up-down direction (longitudinal direction); the gas outlets are placed communicating with the internal hollow. Inert gas introduced in the hollow flows out inside the casing 13' from these gas outlets 391 and 392 and 491 and 492 along the directions of the arrows in FIG. 3 so that gas inside the casing 13' will be replaced by the inert gas.

In each sequence of the purging gas outlets of this example, 25 through holes are arranged in an up-down direction, respectively. Also, the gas outlets in the respective sequences are placed to direct inert gas blowing from each sequence toward different angles with respect to the center of the wafers W.

Additionally, although not depicted, each purging gas outlet hole is formed in a position that faces a gap space in an up-down direction between any two adjacent wafers W stacked in layers, as viewed from above, in other words, a position corresponding to a height between these two wafers W along the cylindrical lateral wall of each cylindrical tube. In consequence, inert gas is supplied in a total of eight directions toward the center of the wafers W from the respective purging manifolds 13A, 13B, 13C, 13D.

Figure 5:
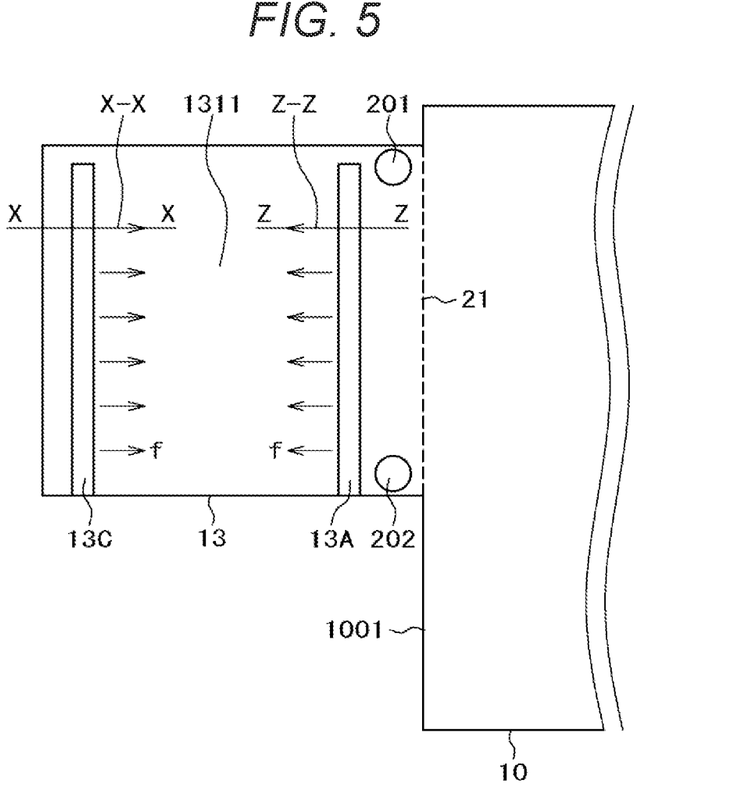
FIG. 5 is a diagram of a longitudinal section schematically depicting an outline of the structure of the wafer preserving container of the atmospheric transfer unit relevant to the example depicted in FIG. 2.

FIG. 4 and FIG. 5 are diagrams of longitudinal sections schematically depicting an outline of the structure of the wafer preserving container 13 of the atmospheric transfer unit 106 relevant to the example depicted in FIG. 2. FIG. 4 depicts a section of the wafer preserving container 13 installed onto the side wall of the EFEM 10 cut through a vertical plane at and along the opening. FIG. 5 depicts a longitudinal section of the installed wafer preserving container 13 cut through a vertical plane ranging from the opening to the back side. FIGS. 4 and 5 depict the upper exhaust ports 201 and the lower exhaust ports 202 and exhaust flows f around them and the purging manifolds 13A, 13B, 13C, 13D and gas flows around them.

In the wafer preserving container 13, as is depicted in FIG. 4, two upper exhaust ports 201, each having a cylindrical form, are placed near the top end of the opening portion 21 having a size slightly smaller than the plane of the casing 13' and two lower exhaust ports 202 are placed near the bottom end of the opening portion with the axis of the cylindrical form of each port being along a horizontal direction (a left-right direction in FIG. 4) and in a position in which the axis is in parallel with the plane of the opening portion 21 of the wafer preserving container 13, as viewed from above, as is depicted in FIG. 5. The two upper exhaust ports 201 and the two lower exhaust ports 202 near the bottom end are installed with one end of each port contacting with either of the left and right inner walls of the casing 13' of the wafer preserving container 13 and placed, spaced from each other by an interval in a central region of the opening portion 21 in a left-right direction. Furthermore, each pair of ports is placed in positions with the axis of the cylindrical form of each port being aligned even in an up-down direction and a front-back direction or approximate positions which can be considered comparable to such positions.

Furthermore, as is depicted in FIG. 4, the wafer preserving container 13 is provided with a wafer detection sensor 25 on the bottom of the casing 13' and in a position between the two lower exhaust ports 202, as viewed from the front of the opening portion 21. This wafer detection sensor 25 detects whether a wafer W exists (presence or absence of a wafer W) in a wafer W stacking space inside the casing 13' above it. This wafer detection sensor 25 may be placed on the ceiling surface of the casing 13' and in a position between the two upper exhaust ports 201 located in the top part of the opening portion 21.

As is depicted in FIG. 4, each of the upper exhaust ports 201 and the lower exhaust ports 202 is a tube having a cylindrical form and has a space inside it extending axially to allow gas to pass through it. Moreover, on the surface of the lateral wall of the cylindrical form, through holes (exhaust holes) 191, 192 communicating with the inside space of the container are placed in multiple positions spaced at a predetermined interval in a direction along the foregoing axis and facing the interior of the wafer preserving container 13. In this example, among multiple sets of through holes (exhaust holes) 191, 192, a series of through holes (exhaust holes) 191 of each upper exhaust port 201 is arranged in line in positions opposite to the bottom of the casing 13' in the lateral wall surface of the cylindrical form (the underside surface of each upper exhaust port 201 in FIG. 4), particularly in positions on the tube underside perpendicular to the axis of the upper exhaust port 201. In addition, a series of through holes (exhaust holes) 192 of each lower exhaust port 202 is arranged in line in positions opposite to the ceiling of the casing 13' in the lateral wall surface of the cylindrical form (the top side surface of each lower exhaust port 202 in FIG. 4), particularly, positions on the tube top side perpendicular to the axis of the lower exhaust port 202.

In each of the upper exhaust ports 201 and the lower exhaust ports 202, the interior of one end connected to either of the side walls of the casing 13' is made to communicate with an exhaust pump, which is not depicted, connected to an outer wall of the casing 13' through an exhaust piping, which is not depicted, and via a through hole placed in a side wall member of the casing 13'. Gas inside the wafer stacking space in the casing 13' passes through the through holes 191 and 192 arranged in the lateral walls of the upper exhaust ports 201 and the lower exhaust ports 202 and the internal spaces of the ports and is discharged as exhaust gas outside the casing 13', as marked with arrows for the upper exhaust ports 201 and the lower exhaust ports 202 in FIG. 4.

As is depicted in FIG. 5, the wafer preserving container 13 in the present example is installed in an intermediate position between the top and bottom ends of the left side wall 1001 of the casing, as the EFEM 10 is viewed from front, and communicates with the interior of the EFEM 10 via the opening portion 21. Inside the wafer preserving container 13, in a direction from the opening portion 21 toward the back side (the left side in FIG. 5), the upper exhaust ports 201, the lower exhaust ports 202, the purging manifolds 13A (13B), the wafer stacking space 1311, and the purging manifolds 13C (13D) are placed in the mentioned order. Wafers W stacked in the wafer stacking space 1311 are sandwiched back and forth between a pair of the purging manifolds 13A, 13B and a pair of the purging manifolds 13C, 13D in a contactless manner.

As noted above, the purging manifolds 13A, 13B, 13C, 13D (those 13A and 13C only are depicted in FIG. 5) are provided with two sequences of through holes arranged at a predetermined interval along the axial direction of each cylindrical tube (height direction) such that each through hole is positioned, facing a gap space between two multiple stacked wafers W. Inert gas that is introduced from these through holes forms airflows f in a horizontal direction (a left-right direction in FIG. 5) toward a central region of the wafers W or the wafer stacking space. Note that a dashed line marked with the reference sign as the opening portion 21 in this figure only indicates the position of a plane that becomes a boundary between the inside space of the wafer preserving container 13 and the inside space of the EFEM 10; it does not mean that a structure like this is placed in the end face of the wafer preserving container 13.

Figure 6:
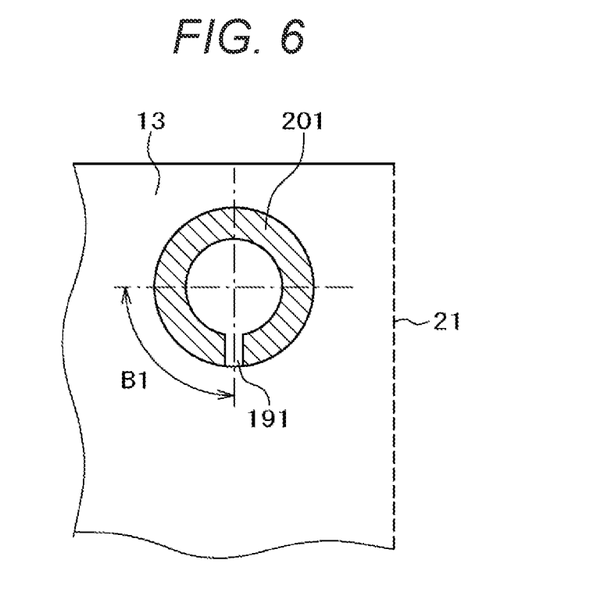
FIG. 6 is a diagram of a longitudinal section schematically depicting an outline of the structure of an upper exhaust port of the wafer preserving container relevant to an example depicted in FIG. 4.
Figure 7:
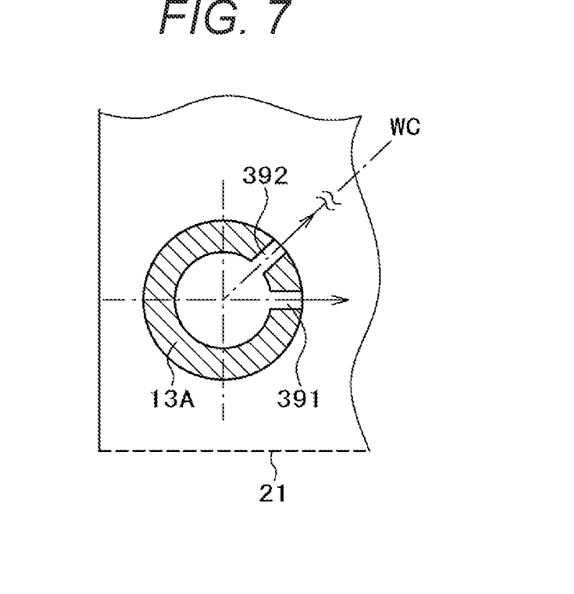
FIG. 7 is a diagram of a cross section schematically depicting the structure of a purging manifold in the wafer preserving container relevant to an example depicted in FIG. 5.
Figure 8:
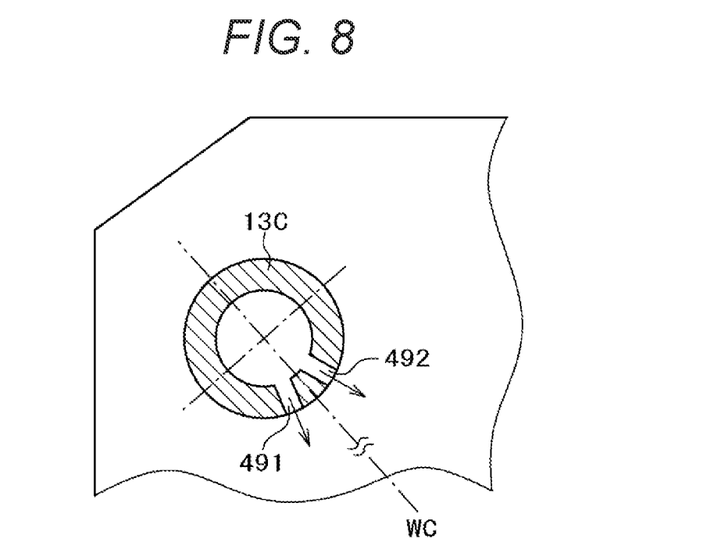
FIG. 8 is a diagram of a cross section schematically depicting the structure of a purging manifold in the wafer preserving container relevant to the example depicted in FIG. 5.

FIGS. 6 through 8 which will be next referred to depict an outline of a peripheral structure around each through hole in the upper exhaust ports 201 and the purging manifolds 13A, 13C depicted in FIGS. 4 and 5.

FIG. 6 is a diagram of a longitudinal section of an upper exhaust port schematically depicting an outline of the structure of an upper exhaust port of the wafer preserving container relevant to an example depicted in FIG. 4. This figure shows an enlarged view of the longitudinal section cut through a vertical plane along the C-C line as in FIG. 4.

The upper exhaust ports 201 and the lower exhaust ports 202 in the present example have one sequence of through holes having a circular cross section, arranged at a predetermined interval in the lateral wall surface of each cylindrical tube in a cylinder axial direction. From these through holes, internal gas in the wafer preserving container 13 flows into the internal space of the tube and is discharged outside the casing 13' of wafer preserving container 13 from the end of each tube. One of such through holes is depicted as an exhaust hole 191 in FIG. 6.

In each of the upper exhaust ports 201 and lower exhaust ports 202, a sequence including 10 to 15 pieces of exhaust holes 191 which are arranged in line in a tube axial direction. In FIG. 6, the exhaust hole 191 of the upper exhaust port 201 depicted in the cross section cut along the C-C line as in FIG. 4 is placed such that its circular opening is in parallel or at an angle approximate to parallel, which can be considered comparable to it, with the plane of the opening portion 21 drawn with a dashed line, as depicted, so that gas will flow into the tube from downward to upward. In other words, the upper exhaust ports 201 are installed in the wafer preserving container 13 with an angle B1 of the axis of each exhaust hole 191 formed with respect to the horizontal plane of the wafer preserving container 13 being 90 degrees or an angle approximate to 90 degrees.

The upper exhaust ports 201 and the lower exhaust ports 202 are configured such that the angle B1 of each through hole 191, 192 can be adjusted up or down by the user of the vacuum processing apparatus 100 according to usage by rotating each tube around its axis, connecting the tube to the casing 13', and securing it in position. Furthermore, depending on the magnitude of the angle B1 of the axis of each exhaust hole 191 of the upper exhaust ports 201 or each exhaust hole 192 of the lower exhaust ports 202, the amount and a flow direction of gas flowing from inside the EFEM 10 into the interior of the wafer preserving container 13 as well as the degree of sticking of fine particles onto wafers W stacked inside the container and the degree of resulting contamination are adjusted. In this regard, an explanation will be made later with drawings.

FIG. 7 is a diagram of a cross section schematically depicting the structure of a purging manifold in the wafer preserving container relevant to an example depicted in FIG. 5. This diagram depicts a cross section of a purging manifold 13A depicted in FIG. 5, when cut through a horizontal plane along the Z-Z line.

As is depicted in FIG. 7, each of the purging manifolds 13A, 13B in the present example is provided with two sequences of gas outlets 391 and 392 opened along the axis in a vertical direction between the internal hollow through which inert gas will pass and the cylindrical peripheral wall surface and arranged in parallel, spaced at a predetermined interval in the axis direction; each sequence has 25 gas outlets. In this figure, for a gas outlet 391 of two gas outlets, the axis of the gas outlet 391 is set so that inert gas supplied through the tube will flow out horizontally in parallel with the plane of the opening portion 21 positioned between the interior of the wafer preserving container 13 and the interior of the EFEM 10 and depicted as a dashed line.

Furthermore, a gas outlet 392 belonging to another sequence is positioned so that inert gas being supplied will flow out toward the center of the wafer stacking space inside the wafer preserving container 13. In other words, the gas outlet 392 belonging to one sequence is formed such that the central axis of its circular opening forms an angle of 45° with respect to the direction of the axis of the gas outlet 391 belonging to the other sequence and in a horizontal direction.

In the purging manifold 13B, the gas outlets 391, 392 as above are arranged to be formed in symmetrical positions, as viewed from front of the opening portion 21 of the wafer preserving container 13. Hence, inert gas (purging gas) to be supplied from the sequence of gas outlets 392 of the purging manifold 13A flows toward a vertical axis passing through the center of wafers W, if wafers W have been stacked in the stacking space of the wafer preserving container 13; likewise, this is also true for purging gas to be supplied from the sequence of gas outlets 392 of the purging manifold 13B. In addition, the flows of purging gas to be supplied from the sequence of gas outlets 391 of the respective purging manifolds 13A, 13B flow from the edge regions in a left-right direction toward the central region of the opening portion 21 in a manner of opposing each other inside the casing 13' immediately behind the opening portion 21 of the wafer preserving container 13.

Moreover, the respective pairs of 25 gas outlets 391, 392 constituting each sequence are formed in the lateral wall surfaces of the purging manifolds 13A, 13B such that the axes of the openings thereof are set in corresponding height positions between two adjacent ones of multiple wafers W stacked in the stacking space or between a wafer W and the inside ceiling or bottom of the casing 13' of the wafer preserving container 13. By virtue of this configuration, purging gas supplied from the gas outlets 391, 392 can smoothly flows through the gaps between two adjacent wafers W even in a state when 25 wafers W are stacked inside the wafer preserving container 13.

FIG. 8 is a diagram of a cross section schematically depicting the structure of a purging manifold in the wafer preserving container relevant to the example depicted in FIG. 5. This figure depicts a cross section of a purging manifold 13C depicted in FIG. 5, when cut through a horizontal plane along the X-X line.

As is depicted in this figure, the purging manifolds 13C, 13D have two sequences of gas outlets, each sequence including 25 gas outlets 491, 492, arranged at a predetermined interval in an up-down direction along a vertical axis of their cylindrical form, as is the case for the purging manifolds 13A, 13B. In the outer peripheral wall surface of the cylindrical form of each purging manifold, these gas outlets are placed along a horizontal direction with an angle of 30° formed between the central axes of their circular openings. Moreover, these gas outlets are placed such that a bisector line of the angle formed between these axes goes toward a vertical axis passing through the center of wafers W stacked in the stacking space of the wafer preserving container 13.

As with the purging manifolds 13A, 13B, inside the casing 13', a pair of the purging manifolds 13C, 13D is placed in symmetrical positions with respect to a plane passing through the center of the wafer preserving container 13 in a left-right direction and the gas outlets 491, 492 of the respective manifolds are also placed in the symmetrical positions. In addition, the respective pairs of the gas outlets 491, 492 constituting the abovementioned two sequences, respectively, are arranged in corresponding height positions intermediate between two adjacent ones of multiple wafers W stacked in the stacking space of the wafer preserving container 13 or between a wafer W and the ceiling or the bottom of the casing 13', as is the case for the pairs of the gas outlets 391, 392 of the purging manifolds 13A, 13B. By virtue of this configuration, purging gas being supplied from the gas outlets 491, 492 smoothly flows through the gaps between two adjacent wafers W even in a state when 25 wafers W are stacked inside the wafer preserving container 13. Arrangement to direct purging gas to flow in this way makes it possible to carry highly reactive particles floating and staying in the vicinity of the front and back surfaces of wafers W and particles flowing from inside the EFEM 10 into the wafer preserving container 13 toward the direction of the central axis of the wafers W, using purging gas from the purging manifolds 13A, 13B or 13C, 13D.

Figure 9:
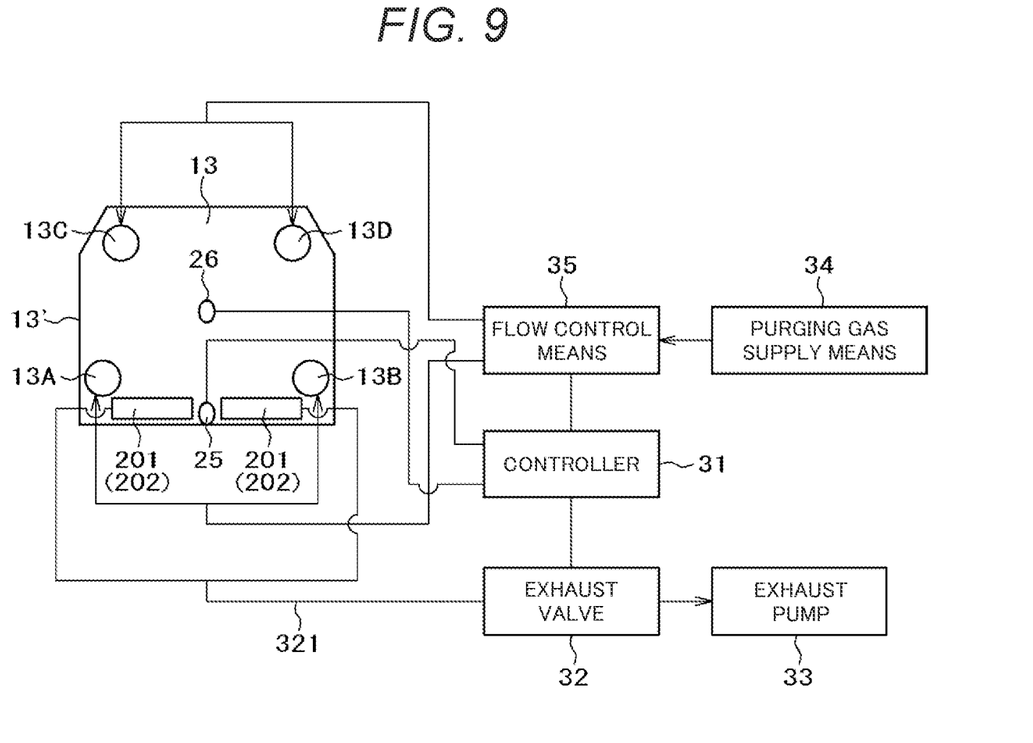
FIG. 9 is a block diagram schematically depicting an outline of the structure of the wafer preserving container depicted in FIG. 2.

With FIG. 9, an explanation is provided about a configuration to control the supply of purging gas into the wafer preserving container 13 in the present example. FIG. 9 is a block diagram schematically depicting an outline of the structure of the wafer preserving container 13 depicted in FIG. 2.

Airflows inside the wafer preserving container 13 are influenced by presence or absence of a wafer W in the stacking space and, therefore, the configuration for purging gas control depicted in FIG. 9 is provided with a humidity sensor 26 which is placed inside the casing 13' of the wafer preserving container 13 to detect humidity inside the container and a wafer detection sensor 25 to detect presence or absence of a wafer W in the stacking space, and is provided with a controller 31 which receives a signal output from these sensors. Furthermore, the controller 31 is connected with an exhaust valve 32 which is placed in the exhaust piping connected to the respective ends of the upper exhaust ports 201 and the lower exhaust ports 202 and adjusts to increase or decrease the amount and velocity of the exhaust or to open and close the piping and a flow controller (a mass flow controller) 35 which is placed in the purging gas supply piping whose one end is connected to the purging manifolds 13A, 13B, 13C, 13D and adjusts the flow rate and velocity of purging gas (inert gas) so that the controller can send a command signal to control operation of the exhaust valve and the flow controller and receive a signal indicating an operation status from them. Additionally, the exhaust piping is connected to an exhaust pump such as a rotary pump at downstream of the exhaust valve 32 in the exhaust flow and the purging gas supply piping is connected to purging gas supply means 34 including a reservoir tank which is an inert gas source and a valve to open and close passage of gas flowing out from the tank at upstream of the flow controller 35.

In the configuration as above, the controller 31 decides whether a wafer W is stacked from a received output signal of the wafer detection sensor 25. If it is decided that no wafer W is stacked, because there is little effect of baffling the purging gas by wafers W, the controller 31 sends the exhaust valve 32 a command signal to adjust it to maximize its degree of opening. In the inside space of the EFEM 10, this enables it to lessen disturbance of gas that flows downward along the inner wall of the EFEM 10 from above the opening portion 21 of the wafer preserving container 13, when deflected away from the inner wall of the EFEM 10 at or below the top end of the opening portion 21, and to reduce the amount and velocity of gas that flows into the wafer preserving container 13, changing its direction. Also, concurrently with this, the controller 31 detects humidity inside the wafer preserving container 13 from a signal received from the humidity sensor 26 and uses the detected humidity information as an objective function in computing a control sequence. The controller sends the flow controller 35 a command signal obtained in accordance with a sequence or an algorithm stored in advance in internal storage equipment and adjusts the amount or velocity of purging gas supplied from the purging gas supply means 34 to the respective purging manifolds 13A, 13B or 13C, 13D.

If the controller 31 has decided that a wafer or wafers W are stacked inside the wafer preserving container 13, the degree of opening of the exhaust valve 32 is adjusted depending on the number of wafers W that are stacked or carried in and out. From the above, it is possible to appropriately increase or decrease the exhaust gas flow through the exhaust piping 321 connecting to the upper exhaust ports 201 and the lower exhaust ports 202 by adjusting the degree of opening of the exhaust valve depending on whether or not a wafer is mounted in the wafer preserving container 13, so that airflows inside the wafer preserving container 13 can remain apt.

According to the foregoing example, inside the wafer preserving container 13, by providing four cylindrical ports disposed in both left and right positions and having an axis in a left-right direction (a horizontal direction) in each of the upper edge region and the lower edge region between the opening portion 21 and the purging manifolds 13A, 13B, namely, the upper exhaust ports 201 having multiple exhaust holes 191 and the lower exhaust ports 202 having multiple exhaust holes 192, each exhaust hole facing toward the interior of the wafer preserving container 13 along the axial direction, it is possible to lessen the entrance of a flow of gas with relatively high humidity from inside the EFEM 10 into the wafer preserving container 13. Specifically, at least some of gas inside the EFEM 10 intruded into the wafer preserving container 13 through the opening portion 21 is discharged outside the casing 13' via the exhaust piping 321 by operation of the upper exhaust ports 201 and the lower exhaust ports 202. Thereby, in some of down flows, a flow is formed which flows toward the lower exhaust ports 202 after flowing from the side wall onto which the wafer preserving container 13 was installed, of the EFEM 10, and along the opening portion 21, and this flow can be used as a sealing flow to block other down flows inside the EFEM 10 from intruding into the wafer preserving container 13.

Specifically, a downward airflow that is formed by the FFUs 14 placed in the top part of the interior of the EFEM 10 flows along the surface of the side wall onto which the wafer preserving container 13 was installed at the left end of the EFEM 10 as depicted in FIG. 2. Furthermore, in a section facing the opening portion 21, when the down flow flows, vertically traversing the opening portion 21, the flow flowing along the side wall from above the opening portion 21 deflects away from the side wall and turns into the flow that includes disturbance including a flow that swirls in a vortex and a disturbance component develops into a swirling flow, while moving down.

In the present example, the upper exhaust ports 201 having multiple openings of the exhaust holes 191 facing down suction gas inside the casing 13' from downward to upward and discharge the gas; by this operation, a flow that is going to transverse the region of the opening portion 21 from above early deflects away from the side wall and a vortex component is formed in the flow. When this vortex is formed, kinetic energy of a downward airflow (down flow) flowing near the opening portion 21 is consumed and a quantity such as flow velocity or momentum can be decreased. In this consequence, inside the wafer preserving container 13, it is possible to form more flow components that flow from the rear of the wafer preserving container 13 toward the opening portion 21 in the front as a part of the flows that are formed by purging gas supplied from the purging manifolds 13A, 13B, 13C, 13D to the stacking space inside the container.

Moreover, there is a reduction in the amount of a swirling airflow flowing from inside the EFEM 10 into the wafer preserving container 13 through the opening portion 21. In consequence, this can decrease the amount of gas that is sucked into the casing 13' from inside the EFEM 10 in the vicinity of the opening portion 21.

Furthermore, the supply of purging gas into the casing 13' along the abovementioned sealing flow serves to gradually dilute the gas with relatively high humidity intruded into the casing 13' from inside the EFEM 10. Hence, even a small amount of purging gas will restrain the rise of humidity inside the wafer preserving container 13 and it is possible to lessen occasions in which a volatile substance remaining on or near the surface of a wafer W reacts with moisture and a corrosive product is formed.

Again, in the present example, the cylindrical upper exhaust ports 201 and lower exhaust ports 202 which are disposed inside the wafer preserving container 13 are placed horizontally in being connected to each of the left and right edges of the casing 13', as the opening portion 21 is viewed from inside the EFEM 10, between the purging manifolds 13A, 13B and the opening portion 21 in the vicinity of the inside ceiling and bottom of the wafer preserving container 13; no exhaust ports are placed in a so-called intermediate section between the vicinity of the ceiling (the upper edge region) and the vicinity of the bottom (the lower edge region). This is because, if exhaust ports are placed in the intermediate section, they have to be placed along vertical side walls inevitably to avoid becoming obstacles when a wafer W is carried in and out and, if exhaust ports are so placed, there is an increase in the amount of gas that flows in from inside the EFEM 10 and replaces gas inside the wafer preserving container 13.

In addition, the forgoing explanation about an advantageous effect regards a state in which no wafer W is mounted in the wafer preserving container 13. However, when a wafer or wafers W are stacked inside the wafer preserving container 13, the wafers W take a role of baffle plates and, therefore, a larger amount of purging gas that stays between two adjacent wafers is easily provided in comparison with when there is no wafer W in the container. Hence, the gas with relatively high humidity flowing into the wafer preserving container 13 is decreased more effectively and this leads to processing yield improvement.

Figure 10:
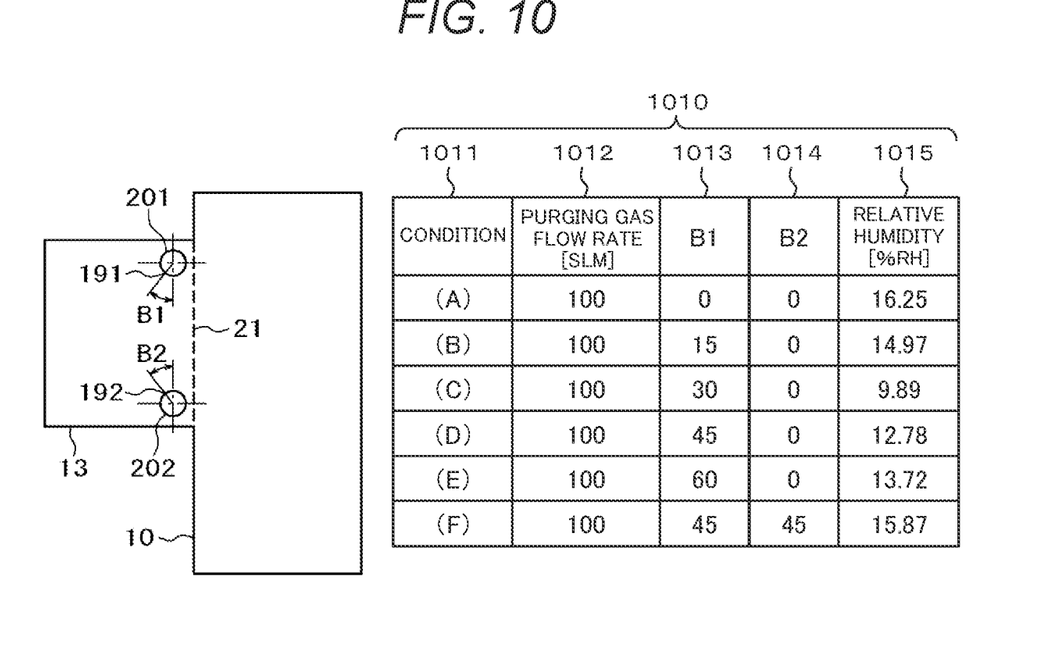
FIG. 10 is a table representing an example of change in humidity inside the wafer preserving container depending on change of the angle of each exhaust hole of the exhaust ports disposed inside the wafer preserving container relevant to an example depicted in FIG. 2.

FIG. 10 is a table representing an example of change in humidity inside the wafer preserving container depending on change of the angle of each exhaust hole of the exhaust ports disposed inside the wafer preserving container relevant to an example depicted in FIG. 2. As is presented in FIG. 10, as for humidity in the wafer preserving container 13, it is possible to change the magnitude of relative humidity inside the wafer preserving container 13 by the angle B1 of each exhaust hole 191 of the upper exhaust ports 201. Here, although the angle B1 in FIG. 6 was explained as an angle with respect to a line perpendicular to the opening portion 21, the angle B1 as in FIG. 10 is different from the angle B1 explained in FIG. 6 and is an angle with respect to a line in parallel with the opening portion 21.

The reason why it is possible to change the magnitude of this relative humidity is that it is possible to change time during which purging gas stays inside the wafer preserving container 13 depending on the magnitude of the angle B1 of each exhaust hole 191. Purging gas flows can be optimized by optimizing the magnitude of the angle B1 of each exhaust hole 191 of the upper exhaust ports 201 inside the wafer preserving container 13 with respect to a downward vertical direction depending on the rate of airflows from inside the EFEM. Likewise, the angle B2 of each exhaust hole 192 of the lower exhaust ports 202 with respect to an upward vertical direction may be configured to be adjustable variably.

Additionally, each exhaust hole 191 of the upper exhaust ports 201 and each exhaust hole 192 of the lower exhaust ports 202 may be an opening with one or more slits as a concatenation of multiple holes, not only a circular opening. In addition, exhaust holes with a circular opening, an oval opening, or a slit opening may be placed in multiple positions as those having different angles B1. For example, a subset of multiple exhaust holes may be placed in a position and an orientation where angle B1=45° for condition (D) in FIG. 10 and other exhaust holes may be placed in a position and an angle in parallel with a vertically extending plane that corresponds to the opening portion 21, as angle B1=0° for condition (A). The user can choose suitable placement of the exhaust holes 191 and 192 taking account of balancing coordination among the following: the amount and velocity of an airflow that flows into the container from inside the EFEM 10 at a deflecting angle, in which these amount and velocity will change depending on where the wafer preserving container 13 is installed on the EFEM 10; exhaust capacity of the upper exhaust ports 201 and the lower exhaust ports 202; and the amount of purging gas that is introduced from the purging manifolds 13A, 13B, 13C, 13D.

Figure 11:
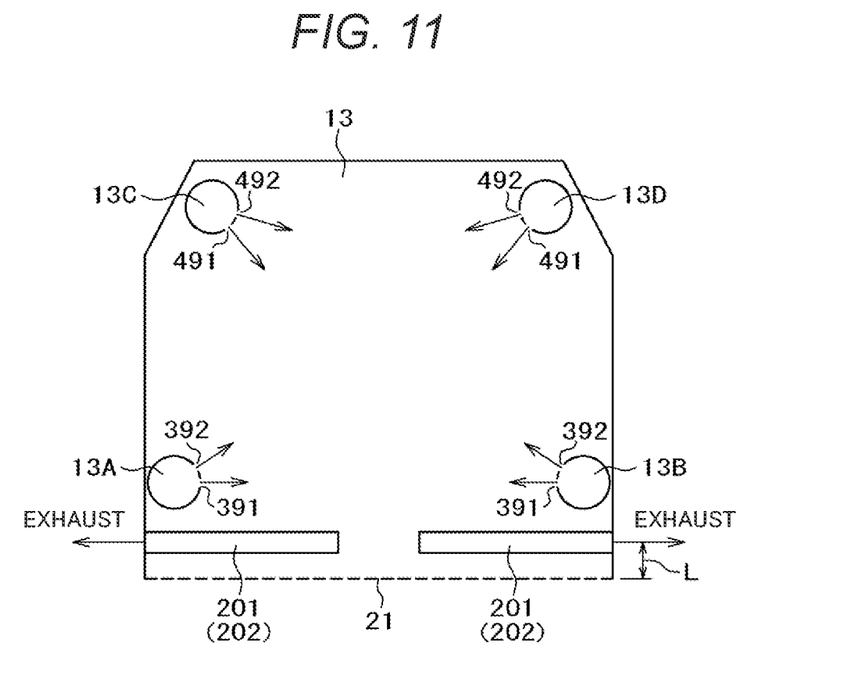
FIG. 11 a diagram of a cross section schematically depicting an outline of the structure of the wafer preserving container relevant to the example depicted in FIG. 2.

FIG. 11 a diagram of a cross section schematically depicting an outline of the structure of the wafer preserving container relevant to the example depicted in FIG. 2. This figure shows the positions of the upper exhaust ports 201 or the lower exhaust ports 202 with respect to the opening portion 21.

Distance L from the installation positions of the upper exhaust ports 201 and the lower exhaust ports 202 to the opening portion 21, as is marked in FIG. 11, may be chosen to enable appropriate usage of the wafer preserving container according to the specifications of the EFEM 10 that the vacuum processing apparatus 100 uses. This figure depicts only the upper exhaust ports 201. In this example, a horizontal distance L between the central axis of each of the cylindrical upper exhaust ports 201 along a horizontal direction (a left-right direction in FIG. 11) and a dashed line indicating the position of the plane of the opening portion 21 is set to 45 mm. Depending on the value of this distance L, a change is made in the flow direction and rate of gas flowing from inside the EFEM 10 into the wafer preserving container 13 or in the amount of a swirling flow. Hence, by choosing a value of the distance L appropriately, it is possible to change humidity inside the wafer preserving container 13 and its distribution. Therefore, the user should aptly choose a distance L in view of balancing coordination among the following: the flow rate and velocity of gas inside the EFEM 10; in addition, the supply amount of purging gas; and the amount of exhaust from the upper and lower exhaust ports. For example, the flows of gas inside the EFEM 10 depend on the number, the degree of opening, and shape of the openings of the louver 12 depicted in FIG. 2 or the position of the transfer robot 11. According to a resultant flow rate distribution inside the EFEM 10, the distance L from the upper exhaust ports 201 and the lower exhaust ports 202 to the opening portion 21 may be set to 45 mm±25 mm.

As explained hereinbefore, for the wafer preserving container relevant to the present example, the wafer preserving container that is located on the EFEM inside which down flows are formed has the configuration that is provided with at least one gas purging (introduction) port placed extending in a vertical direction in the back side of the wafer stacking space and gas exhaust ports placed in the top and bottom portions of an entrance region of the wafer preserving container, facing the opening communicating with the interior of the EFEM, but is not provided with gas exhaust ports along the left and right side walls of the entrance.

According to the present example, in a wafer transfer apparatus or a semiconductor manufacturing equipment, it is possible to decrease humidity inside the preserving container, lessen contamination of wafers stacked inside the container, and improve processing yields.

While an example of the invention developed by the present inventors has been explained specifically hereinbefore, it goes without saying that the present invention is not limited to the foregoing example and can be modified in various ways without departing from the scope of the invention. By way of example, the foregoing example is described in detail to explain the present invention to make it easy to understand and the invention is not necessarily limited to an example including all components described. In addition, for a subset of the components of an example, other components may be added to the subset or the subset may be removed or replaced by other components.

REFERENCE SIGNS LIST

10 . . . EFEM
11 . . . transfer robot
12 . . . louver
13 . . . wafer preserving container
14 . . . FFU
21 . . . opening portion
25 . . . wafer detection sensor
26 . . . humidity sensor
31 . . . controller
32 . . . exhaust valve
33 . . . exhaust pump
34 . . . purging gas supply means
35 . . . flow controller
100 . . . vacuum processing apparatus
101 . . . atmospheric block
102 . . . vacuum block
103-1, 103-2, 103-3, 103-4 . . . vacuum processing unit
104-1, 104-2 . . . vacuum transfer chamber
105 . . . lock chamber
106 . . . atmospheric transfer unit
107 . . . cassette stand
108 . . . transfer intermediate chamber
109 . . . atmospheric transfer robot
110-1, 110-2 . . . vacuum transfer robot
191, 192 . . . exhaust hole
201 . . . upper exhaust port
202 . . . lower exhaust port
391, 392, 491, 492 . . . gas outlet
13A, 13B . . . purging manifold
130, 13D purging manifold
B1 . . . angle of an exhaust hole of an upper exhaust port
B2 . . . angle of an exhaust hole of a lower exhaust port
f . . . airflow
W . . . semiconductor water
Wc . . . center of a semiconductor wafer

The invention claimed is:

1. A vacuum processing apparatus comprising: a vacuum processing unit embracing a vacuum vessel with a depressurized inside space into which a wafer to be processed is transferred and processed; a lock chamber into which the wafer before or after being processed is transferred; an atmospheric transfer unit with a casing embracing an atmospheric transfer chamber which is connected with the lock chamber and maintained at atmospheric pressure and inside which gas flows are formed from upward to downward and the wafer is transferred; and a wafer preserving container which embraces a processed wafer stacking space inside thereof, whose front end side is installed onto a wall surface of the casing, and whose interior communicates with the atmospheric transfer chamber via an opening located in the side wall,
wherein the wafer preserving container is provided inside with an exhaust port which is placed behind the opening, in front of the stacking space, and in an upper edge region and a lower edge region relative to the stacking space and exhausts gas in the stacking space to outside and a manifold which is placed behind the stacking space, towards the opening between the upper edge region and the lower edge region, and has gas outlets to supply certain gas into the stacking space.

2. The vacuum processing apparatus according to claim 1, wherein the manifold is placed at a corner in both left and right sides of the stacking space, as viewed from the opening.

3. The vacuum processing apparatus according to claim 1, wherein the wafer preserving container is provided with another manifold which is placed between the stacking space and the exhaust port and supplies the certain gas into the stacking space.

4. The vacuum processing apparatus according to claim 3, wherein the other manifold is placed at a corner in both left and right sides of the stacking space, as viewed from the opening.

5. The vacuum processing apparatus according to claim 1, wherein the exhaust port has a tubular form with its axis extending in a horizontal direction and is placed such that the axis of the tubular form is in parallel with the opening.

6. The vacuum processing apparatus according to claim 5, wherein the exhaust port is provided with at least one exhaust hole in a position on an outside wall surface of the tubular form, the position facing the stacking space.

7. The vacuum processing apparatus according to claim 6, wherein the exhaust port is configured such that an angle at which the exhaust hole faces the stacking space is adjustable.

8. The vacuum processing apparatus according to claim 1, wherein the manifold has a tubular form with its axis extending in a vertical direction and is provided with the gas outlets in multiple positions on an outside wall surface of the tubular form, the gas outlets being positioned between a wafer stacked inside the stacking space and the ceiling or bottom of the stacking space or between two adjacent ones of multiple wafers stacked.

9. The vacuum processing apparatus according to claim 2, wherein the wafer preserving container is provided with another manifold which is placed between the stacking space and the exhaust port and supplies the certain gas into the stacking space.

10. The vacuum processing apparatus according to claim 9, wherein the other manifold is placed at a corner in both left and right sides of the stacking space, as viewed from the opening.

11. The vacuum processing apparatus according to claim 9, wherein the exhaust port has a tubular form with its axis extending in a horizontal direction and is placed such that the axis of the tubular form is in parallel with the opening.

12. The vacuum processing apparatus according to claim 11, wherein the exhaust port is provided with at least one exhaust hole in a position on an outside wall surface of the tubular form, the position facing the stacking space.

13. The vacuum processing apparatus according to claim 12, wherein the exhaust port is configured such that an angle at which the exhaust hole faces the stacking space is adjustable.

14. The vacuum processing apparatus according to claim 9, wherein the manifold has a tubular form with its axis extending in a vertical direction and is provided with the gas outlets in multiple positions on an outside wall surface of the tubular form, the gas outlets being positioned between a wafer stacked inside the stacking space and the ceiling or bottom of the stacking space or between two adjacent ones of multiple wafers stacked.

* * * * *